(12) United States Patent
Liu et al.

(10) Patent No.: US 6,597,936 B1
(45) Date of Patent: Jul. 22, 2003

(54) FOCUSED POINT OVERSAMPLING FOR TEMPORALLY AND SPATIALLY RESOLVING DYNAMIC STUDIES

(75) Inventors: Kecheng Liu, Solon, OH (US); James A. Halamek, Independence, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 250 days.

(21) Appl. No.: 09/712,401

(22) Filed: Nov. 14, 2000

(51) Int. Cl.$^7$ ................................................ A61B 5/05

(52) U.S. Cl. ...................................... 600/420; 600/410

(58) Field of Search ............................... 600/420, 413, 600/410; 324/306, 307, 309

(56) References Cited

U.S. PATENT DOCUMENTS

| | | | | |
|---|---|---|---|---|
| 5,417,213 A | | 5/1995 | Prince | 600/413 |
| 5,590,654 A | | 1/1997 | Prince | 600/420 |
| 5,657,758 A | * | 8/1997 | Posse et al. | 600/413 |
| 6,167,293 A | * | 12/2000 | Chenevert et al. | 600/420 |
| 6,424,153 B1 | * | 7/2002 | Liu et al. | 324/309 |
| 6,434,413 B1 | * | 8/2002 | Liu et al. | 600/140 |

FOREIGN PATENT DOCUMENTS

| | | |
|---|---|---|
| DE | 19811349 C1 | 10/1999 |
| WO | WO 97/24064 | 7/1997 |
| WO | WO 00/37957 | 6/2000 |

OTHER PUBLICATIONS

Vigen, et al. "Undersampled Projection Imaging for Time-Resolved Contrast-Enhanced 3D MR Angiography (PR-TRICKS)", ISMRM 1999, p. 1899.

Foo, et al. Single Bolus Contrast Enhanced Peripheral 3D MRA Using Automated Table Motion Integrated with Automated Bolus Detection and Acquisition Triggering (MR SMARTPREP) ISMRM, 1998 p. 67.

Prince, et al. "Contrast-Enhanced Abdominal MR Angiography: Optimization of Imaging Delay Time by Automating the Detection of Contrast Material Arrival in the Aorta", Radiology 1997; 203:109–114.

Foo, et al. "Automated Detection of Bolus Arrival and Initiation of Data Acquisition in Fast, Three-Dimensional, Gadolinium-Enhanced MR Angiography", Radiology 1997; 203:275–280.

Wilman, et al., "Fluoroscopically Triggered Contrast-Enhanced Three-Dimensional MR Angiography With Elliptical Centric View Order: Application to Renal Arteries", Radiology 1997; 205:137–146.

Vlaardingerbroek, et al. "Magnetic Resonance Imaging", 1996 Springer Verlag, Berlin, Heidelberg XP002193629 pp. 134–136.

(List continued on next page.)

Primary Examiner—Quang T. Van
(74) Attorney, Agent, or Firm—Fay, Sharpe, Fagan, Minnich & McKee, LLP (57) ABSTRACT

A region of interest of a subject is disposed in an imaging region (10) of a magnetic resonance imaging apparatus. A contrast material (70) is injected into the subject. An operator initiates a series of fast scan imaging sequences to track the position for entry of the contrast material, into the region of interest. A trajectory through a k-space is selected for the fast scan imaging sequences that both generates data lines for the fast scan images and oversamples a common data point (76). A peak intensity of the oversampled common point (76) indicates that the bolus of contrast agent (70) has arrived. A sequence controller (40) initiates a diagnostic imaging sequence (80). The operator views the fast scan image and has the option to abort the diagnostic sequence (80) if the fast scan image does not verify that the contrast agent has arrived in the region of interest. The system continues to taking fast scan images until the arrival of the bolus of contrast agent has been verified.

22 Claims, 6 Drawing Sheets

OTHER PUBLICATIONS

Foo, et al. "Automated Detection of Bolus Arrival and Initiation of Data Acquisition in Fast, Three–Dimensional, Gadolinium–enhanced MR Angiography", Radiology, Oak Brook, IL, US vol. 203, 1997, pp. 275–280, XP000921005.

Wilman, et al., "Fluoroscopically–Triggered Contrast–Enhanced Three Dimensional MR Angiography", Proceed. of ISMRM 5th Mtg & Exhib., '97, Vancouver, VC Apr. 12–18, 1997, vol. 1, p. 202, XP002135842.

* cited by examiner

FOCUSED POINT OVERSAMPLING FOR TEMPORALLY AND SPATIALLY RESOLVING DYNAMIC STUDIES

BACKGROUND OF THE INVENTION

The present invention relates to the diagnostic imaging arts. It finds particular application in conjunction with magnetic resonance angiography and will be described with particular reference thereto. It is to be appreciated that the present invention is also applicable to tracking other types of moving objects using magnetic resonance imaging and is not limited to the aforementioned applications.

In magnetic resonance imaging, a uniform main magnetic field is created through an examination region in which a subject to be examined is disposed. A series of radio frequency (RF) pulses are applied to the examination region to excite and manipulate magnetic resonance in hydrogen or other selected dipoles. Gradient magnetic fields are conventionally applied to encode information in the excited resonance.

In contrast enhanced magnetic resonance angiography or drug uptake studies, it is often desired to add a contrast agent to enhance the blood image. That is, the subject is injected with a material that enhances the blood signal. The contrast agent improves the visibility of the circulatory system or specific tissues that absorb the contrast agent in the MRI image.

Typically, after the injection of the contrast agent, there is delay time before it reaches the region of interest (ROI). Various techniques are used to track the injected agent, or bolus, to determine exactly when it region of interest, i.e., when the MRI scan of the region of interest should commence.

One method of bolus tracking is to use a test bolus. A small amount of contrast material is injected into the patient and a series of MR pilot images are gathered. The resultant images are analyzed to determine the transit time of the bolus. The MR scanner is then set to commence an imaging sequence the same transit time after injection of a larger imaging dose of the contrast agent. One drawback of this method is that it is not real time. Another drawback is that this method requires two injections, i.e. more contrast agent is injected than is necessary for the image. Another drawback of this method is that it assumes metabolic functions of the subject remain constant from the pilot scan to the imaging scan. In actuality, the bolus transit time can be affected by subject position, heart rate, blood pressure, and other variables. The test bolus method assumes all of these variables to remain constant from the test sequence to the imaging sequence.

Another MR method includes real-time k-space tracking of the bolus. The contrast agent is injected into the subject and a single line of k-space is sampled repeatedly. The intensity of this single resonance signal is monitored, peaking when the bolus has arrived in the region of interest. An imaging sequence is then initiated. This method has a much higher temporal resolution, (on the order of milliseconds) but has no visual tracking of the dynamic changes of the bolus. Thus, this method is susceptible to factors that cause significant increase in signal intensity such as movement of the patient, and the like. The operator has no way to verify that the signal peak was in fact caused by the arrival of the bolus. It is possible that premature imaging will be initiated.

In another method, the subject is fluoroscopically monitored to detect the arrival of the bolus. A series of MR fluoroscopic images are generated. However, this method has low temporal resolution. Back-to-back MR fluoroscopic images are generated at intervals on the order of a second. It is difficult to interpolate the bolus arrival time accurately from images a second apart.

The present invention provides a new and improved method and apparatus combining high temporal resolution with real time bolus tracking that overcomes the above referenced problems and others.

SUMMARY OF THE INVENTION

In accordance with one aspect of the present invention, a method of magnetic resonance is given. A subject containing a region of interest is disposed in an imaging region of an MRI device. A contrast agent is introduced into the subject's bloodstream. Magnetic resonance is excited, and sampled along various trajectories through k-space that oversample at least one point, the trajectories manipulated by applying gradient pulses. The magnetic resonance signals are received, demodulated and reconstructed while an intensity of the oversampled point is monitored with respect to preselected intensity criteria.

According to another aspect of the present invention, a magnetic resonance apparatus is given. A magnet assembly generates a temporally constant main magnetic field in an examination region. Gradient coils spatially encode the main magnetic field and define sampling paths therethrough. An RF coil assembly excites resonance in dipoles of a subject in the examination region. At least on RF receiver receives magnetic resonance signals. A reconstruction processor reconstructs the resonance signals into an image representation and displays them on a human readable display. An intensity monitor monitors an oversampled point in k-space.

According to another aspect of the present invention, a method of diagnostic imaging is provided. A plurality of data lines is gathered, each data line having at least one oversampled point in common, that is, all data lines intersect at least one common point. The intensity of the oversampled point is monitored. Images are produced. A higher resolution image is produced when both the intensity monitoring and the monitoring images indicate a bolus of contrast agent has arrived in an imaging region.

One advantage of the present invention is that it provides real time visual tracking of a contrast bolus.

Another advantage of the present invention is that it provides temporally high resolution data about the concentration of the bolus.

Another advantage resides in the provision for a confirmatory image.

Another advantage of the present invention is that the data acquisition window can be centered on the region of interest temporally corresponding to the bolus arrival.

Another advantage is that the imaging sequence uses image data collected prior to the detection of the bolus peak.

Another advantage resides in reduced contrast agent dose, simplified operation, and increased throughput.

Another advantage of the present invention is that it is applicable to single echo, multiple echo, full, partial, and undersampled data collection strategies.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
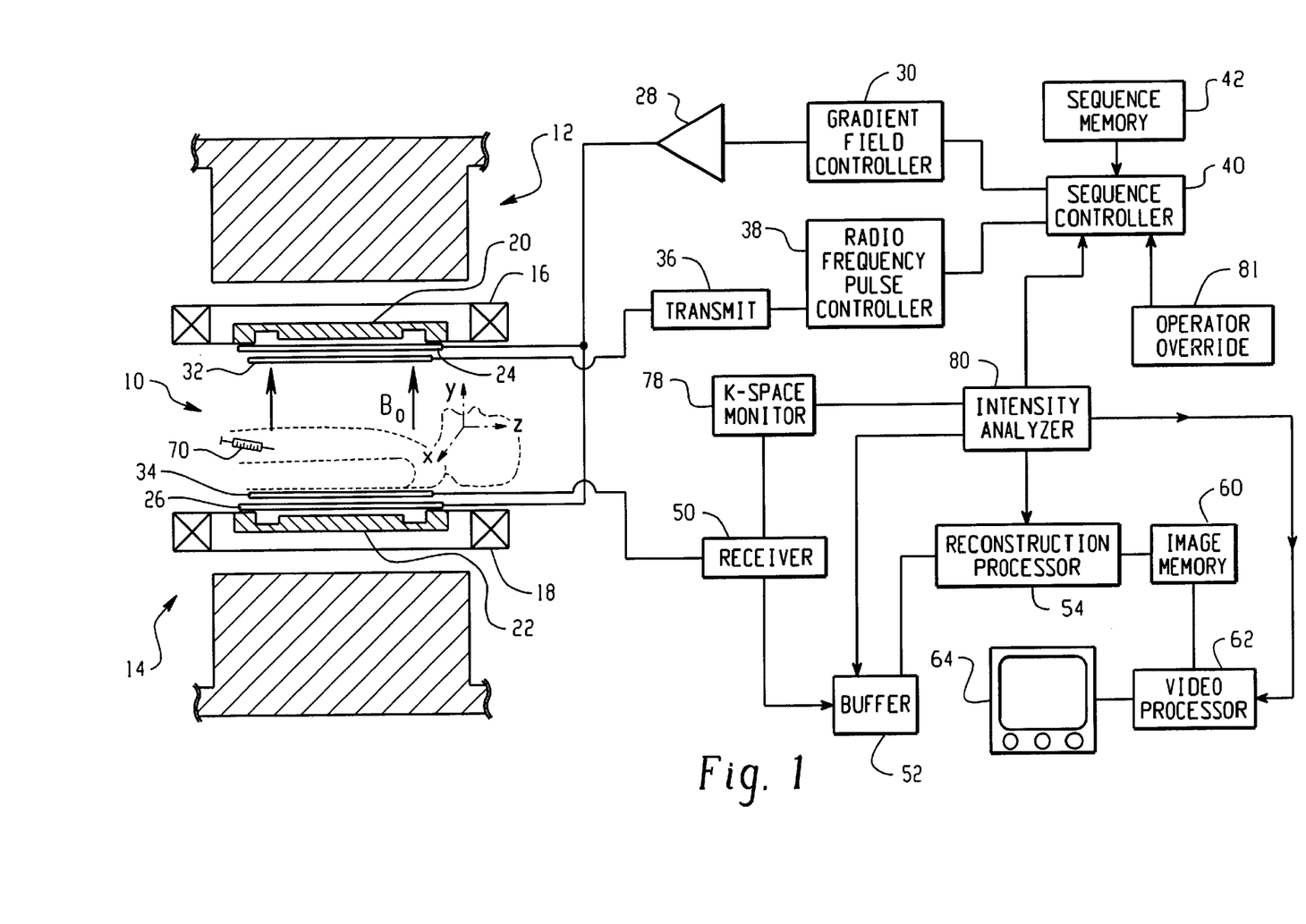
FIG. 1 is a diagrammatic illustration of an MRI apparatus in accordance with the present invention.

With reference to FIG. 1, an open MRI is described for simplicity of illustration. It is to be appreciated that the invention is also applicable to bore or solenoid type MRI systems. In an open MRI system, an imaging region 10 is defined between an upper pole assembly 12 and a lower pole assembly 14. A pair of annular super-conducting magnets 16, 18 surround upper and lower pole pieces 20, 22 generating a temporally constant, main magnetic field $B_o$ through the imaging region 10. It is to be appreciated that the open MRI apparatus may have a variety of pole pieces or, in some instances, no pole pieces at all. Optionally, a ferrous flux return path is provided between the pole assemblies remote from the imaging region 10.

For imaging, magnetic field gradient coils 24, 26 are disposed on opposite sides of the imaging region 10 adjacent the pole pieces 20, 22 in the illustrated open MRI embodiment. The gradient coils are planar coil constructions which are connected by gradient amplifiers 28 to a gradient magnetic field controller 30. In bore type MRI systems, the gradient coils traditionally are mounted around the bore. The gradient magnetic field controller 30 causes current pulses which are applied to the gradient coils such that gradient magnetic fields are superimposed on the temporally constant and uniform field $B_o$ across the imaging region 10. The gradient fields are typically generated along a longitudinal or y-axis, a vertical or z-axis and a transverse or x-axis.

In order to excite magnetic resonance in selected dipoles of a subject disposed in the imaging region 10, radio frequency coils 32, 34 are disposed between the gradient coils 24, 26 and the imaging region 10. At least one radio frequency transmitter 36, preferably a digital transmitter, causes the radio frequency coils to transmit radio frequency pulses requested by a radio frequency pulse controller 38 to be transmitted into the imaging region 10. A sequence controller 40, under operator control, retrieves an imaging sequence from a sequence memory 42. The sequence controller 40 provides the selected sequence information to the gradient controller 30 and the radio frequency pulse controller 38 such that radio frequency and gradient magnetic field pulses in accordance with the selected sequence are generated.

These RF pulses are used to induce and. manipulate magnetic resonance in the subject. In order to produce an image, the resonance signals are detected by the RF coils 32, 34 or by surface or other local coils (not shown) and demodulated by one or more receivers 50, preferably digital receivers. Digital data lines from the receiver in one embodiment are held in a buffer 52. The digital data lines are processed by a reconstruction processor 54 into volumetric or other image representations by applying a rotation back-projection algorithm or other appropriate reconstruction algorithm. The image representations are stored in a volumetric image memory 60. A video processor 62, under operator control, withdraws selected image data from the volume memory and formats it into appropriate data for display on a human readable display 64, such as a video monitor, active matrix monitor, liquid crystal display, or the like.

For magnetic resonance angiography, a contrast agent 70 is injected into the bloodstream to emphasize the blood carried within the vessels. Typically, the contrast agent 70 is injected into the patient remote from the region of interest. When it reaches the region of interest, the concentration ramps up to a peak an then ramps down. The location of the contrast agent is very important to magnetic resonance angiography because it is desired to capture an image of the region of interest when the contrast agent is present.

Figure 2:
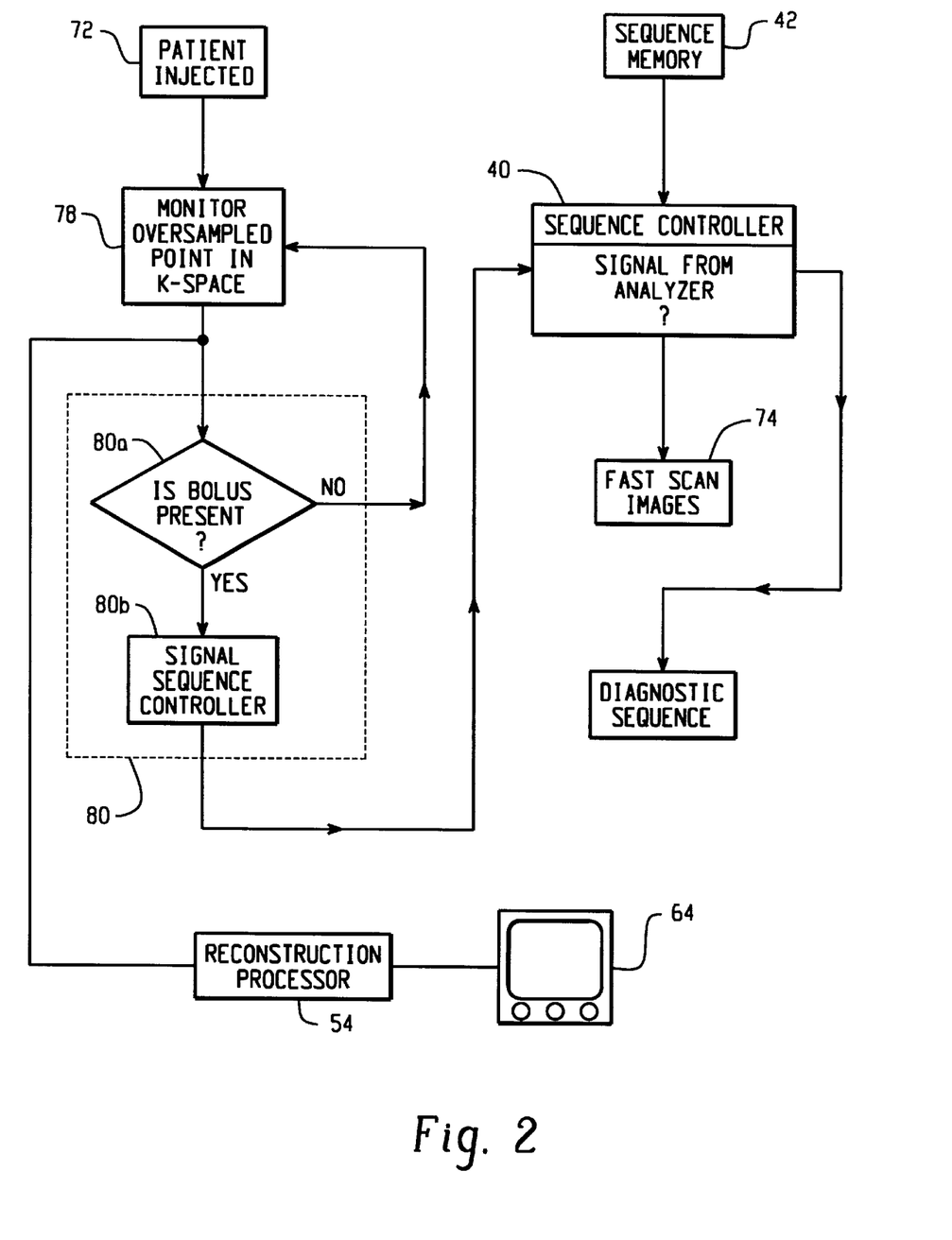
FIG. 2 is a flowchart of and imaging process 10 in accordance with the present invention.
Figure 3A:
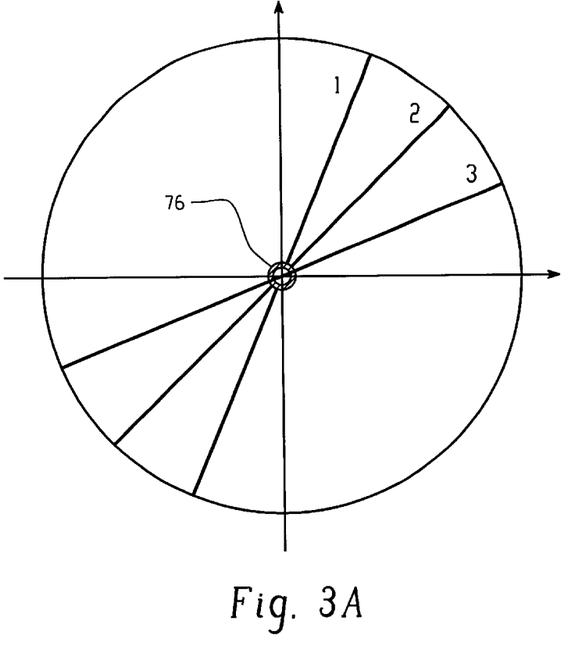
FIG. 3A is a preferred trajectory through k-space.

With Reference to FIG. 2, once the contrast agent 70 has been injected 72 into the patient, the operator signals the sequence controller 40 to begin a series of fast scan imaging sequences 74. The fast scan imaging sequences 74 allow the operator to obtain a visual understanding of where the bolus 70 is in the subject. The sequence controller 40 selects an imaging sequence from the sequence memory 42 that over-samples at least one point in k-space. In the preferred embodiment, the sequence selected comprises a linear trajectory through the center 76 of k-space with each data line rotated about the center of k-space from the preceding lines as shown in FIG. 3A. Although FIG. 3A illustrates three projections or projection data lines, it is to be appreciated that the actual number sampled is typically a couple of orders of magnitude higher, e.g., 64, 256, 1024, etc. This trajectory oversamples the origin of k-space, that is, the k=0 point.

This sampling path is designed to create a fixed reference in k-space that is observable at multiple points in time. This allows the system to monitor the relative signal strength without losing any data valuable for creating an image. This path enables simultaneous realtime image monitoring and temporally high resolution signal strength monitoring.

Figure 3B:
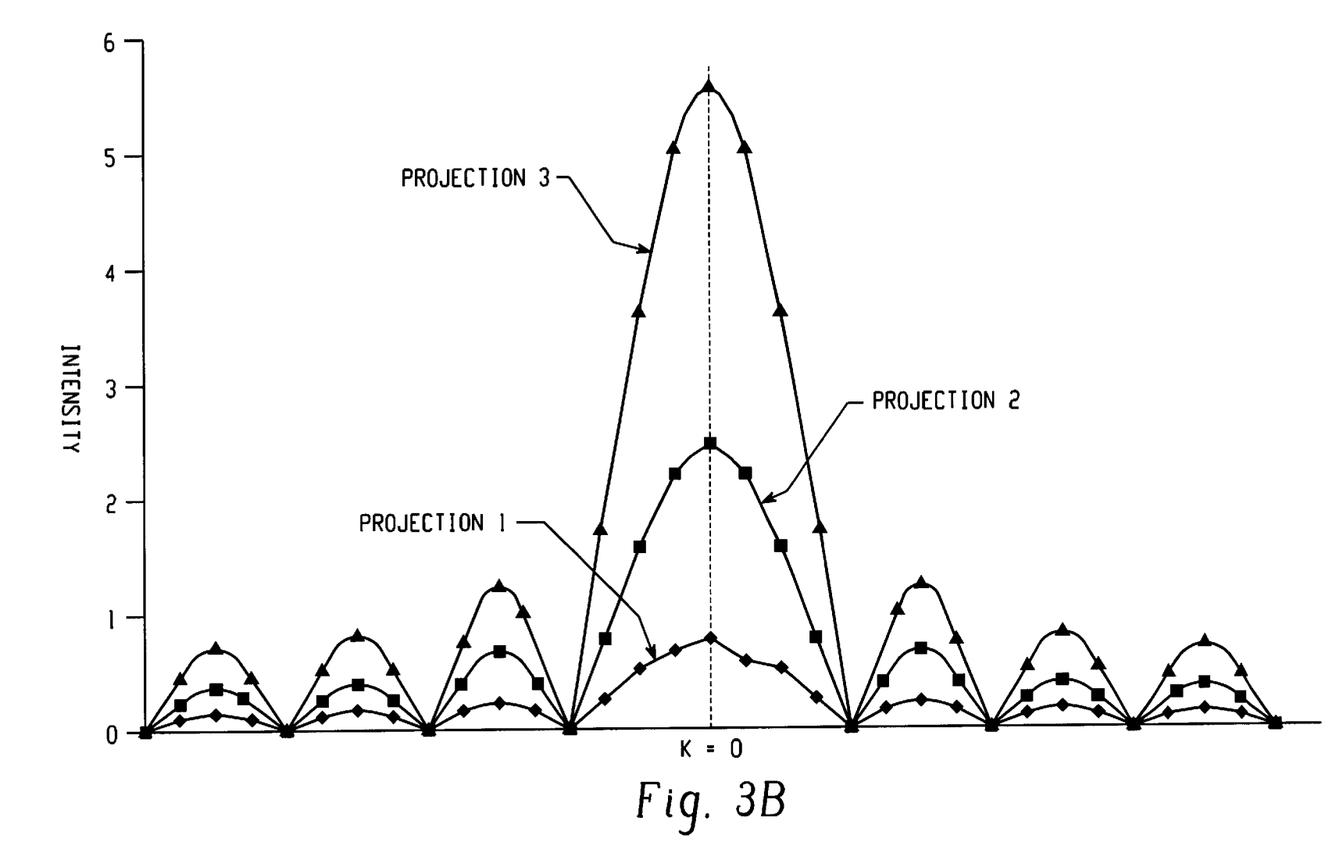
FIG. 3B is a graphical illustration of a peak detection scenario.
Figure 3C:
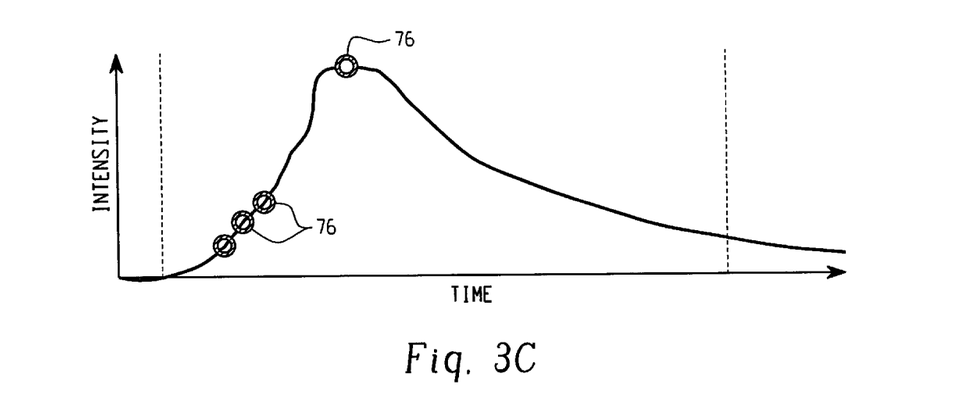
FIG. 3C is an intensity graph of an oversampled point as a function of time.

With continuing reference to FIGS. 1 and 2, every time the k=0 point is sampled, an oversampled point monitor 78 monitors the intensity of the oversampled point 76. An intensity analyzer 80 monitors the change in the over-sampled point intensity which typically follows a Gaussian curve as illustrated in FIGS. 3B and 3C. The analyzer 80 analyzes each iteration of the oversampled point 76 and looks for a peak intensity 80a. Optionally, the analyzer is connected with the video processor to generate a human-readable display of the evolution of the monitored intensity. In the preferred embodiment, the analyzer 80 compares the signal strength illustrated in FIG. 3B. Alternately, the analyzer can apply other comparison techniques, such as derivative extrapolation, comparison to a threshold, detecting a negative magnitude or slope change, or the like. In one embodiment, the reconstruction processor 54 reconstructs an image each time a set of data lines is collected in the buffer 52. In another embodiment, the image is updated with each new data line. As blood enters the imaging region 10, the blood in the images starts to turn dark, verifying that the increase in the oversampled point 76 magnitude is due to the contrast agent 70 entering the region of interest.

Once the analyzer 80 detects the peak, data taken immediately before the peak is combined with data taken at and following the peak to generate the diagnostic image. The data can be centered on the peak, fit to the region with the highest oversampled point intensity, be triggered by the peak, or the like.

In another embodiment, the sequence controller changes the imaging sequence on detection of the contrast agent 70. In one technique, the imaging sequence collects only a fraction of the data lines, such as 64 equally angularly spaced data lines over 180° to generate a low resolution monitoring image. When the contrast agent peak is detected, the sequence shifts to collect intermediate data lines to improve resolution. For example, additional data lines can be collected until the initial 64 data lines is increased to 128, 256, 512, etc. equi-spaced data lines. As yet another option, the imaging sequence changes when the oversampled point intensity crosses a preselected threshold.

In a preferred embodiment, the imaging process is automated, after the injection of the contrast agent 70. However, any time during the process the operator has the option to override the system if he does not agree with the assessment of the analyzer 80. For example, if the subject were to shift positions, it is possible that the analyzer 80 would sense a change in the signal intensity and mistake it for the arrival of the contrast agent. At this point, the operator is viewing the latest low resolution or fast scan image and visually verifies that the bolus has not reached the region of interest. The operator has the option to hold the system in the low resolution or fast scan mode and again search for the arrival of the contrast agent. The operator also has the option to abort the sequence outright. The operator can also alter the data lines which contributes to the diagnostic image in a post processing adjustment.

Figure 4:
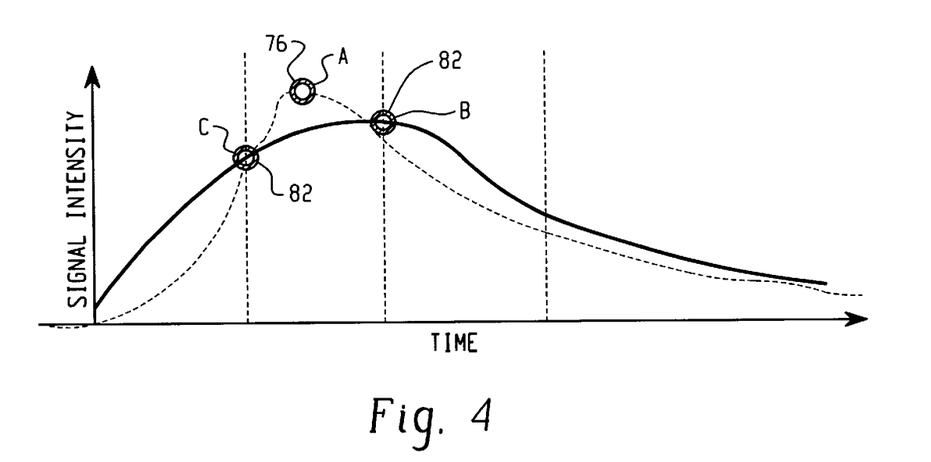
FIG. 4 is a graphical comparison of a k-space signal tracking of a bolus, and a visual image tracking of the same bolus.

With reference to FIG. 4, the oversampled point is sampled point is sampled every data line, typically 64, 128, 256, 512, 1024, or the like times per fast scan image. When images are reconstructed each time a fast scan data set is complete, the images are updated at times 82. The true contrast agent peak A as sensed every data line from the intensity of the oversampled data point may have passed before the images show an image peak at B. By that time, the optimum time for imaging has passed. In the preferred embodiment, the analyzer 80 initiates a diagnostic imaging sequence at point A (optionally including data sensed after about point C), and the operator verifies from the point A image the contrast agent reached the region of interest between updated images.

Figure 5:
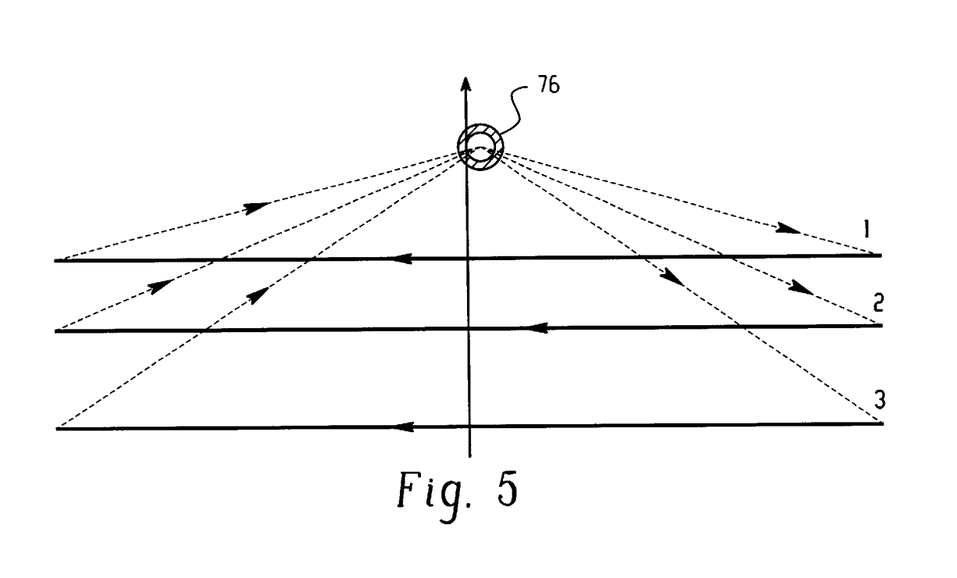
FIG. 5 is an alternate k-space trajectory.

Numerous other trajectories through k-space are also contemplated. With reference to FIG. 5, a series of data lines linearly across k-space are taken. However, a data value at the center of k-space 76 or another common point in k-space is sampled in every data line. Again, it is possible to get signal intensity data and real time images simultaneously.

Figure 6:
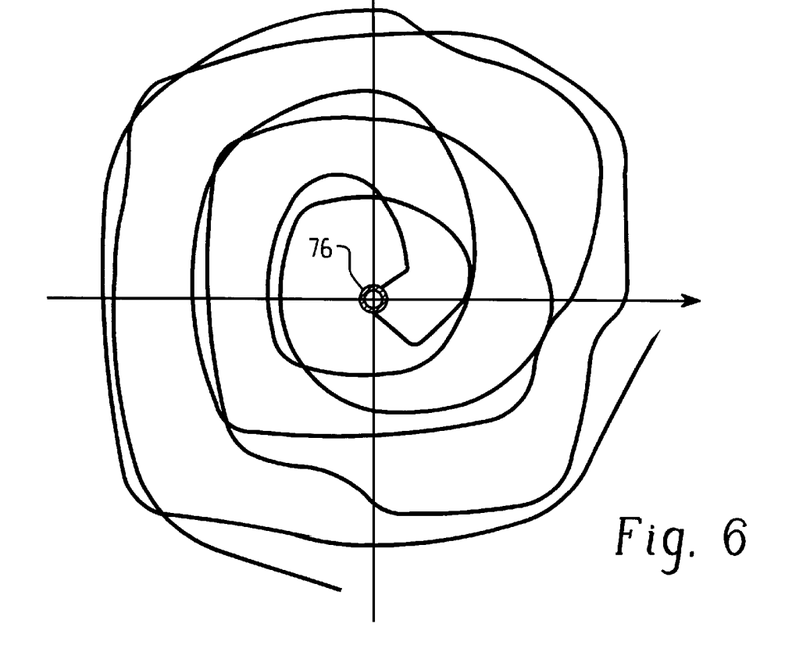
FIG. 6 is another alternate k-space trajectory.

With reference to FIG. 6, each data set can be taken along a special trajectory starting at the center or other common point in k-space. With the multi-resolution spirals illustrated in FIG. 6, an adequate coverage of k-space for a monitoring image can be collected in a few sampling trajectories.

Figure 7:
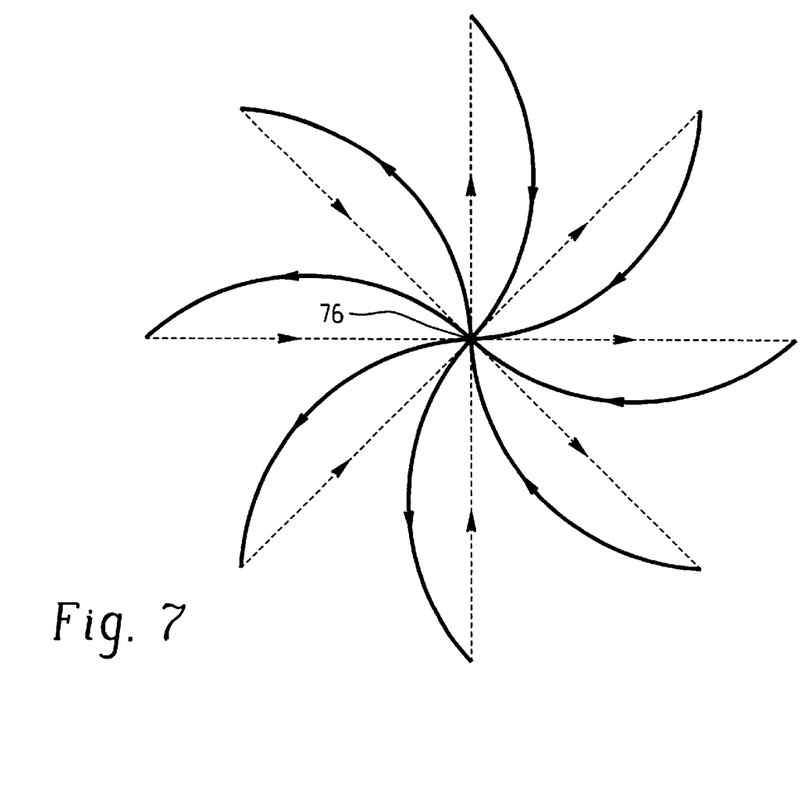
FIG. 7 is another alternate k-space trajectory.

With reference to FIG. 7, the trajectory can follow closed loops each starting at the oversampled point 76. A 180° pulse can be applied to flip the second half of the loop 180°. In this manner, the center point 76 of k-space is sampled once for each two data lines.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
    disposing a region of interest of a subject in an imaging region;
    introducing a contrast agent into the subject for enhancing selected tissue in the region of interest;
    exciting magnetic resonance in dipoles of the imaging region;
    applying gradient pulses that define sampling trajectories through k-space, the sampling trajectories repeatedly sampling at least one common point in k-space;
    receiving the magnetic resonance signals along the sampling trajectories and demodulating the magnetic resonance signals;
    monitoring a signal intensity of the oversampled, common point to determine the presence of the contrast agent in the region of interest; and,
    reconstructing a verification image representation from the demodulated magnetic resonance signals.

2. The method as set forth in claim 1, further including:
    comparing the monitored common point intensities with preselected intensity criteria.

3. The method as set forth in claim 2, further including:
    reconstructing a diagnostic image representation from demodulated magnetic resonance signals received in a preselected temporal relationship to the monitored common point intensities meeting the intensity criteria.

4. The method as set forth in claim 3, wherein demodulated resonance signals used in the verification image representation are also used in the diagnostic image representation.

5. The method as set forth in claim 4, wherein at least some of the demodulated resonance signals used in both the verification and diagnostic image are received prior to the common point intensity meeting the intensity criteria.

6. The method as set forth in claim 1, wherein each sampling trajectory passes through the common point.

7. The method as set forth in claim 6, wherein the common point is the center of k-space.

8. A method of magnetic resonance imaging including:
    disposing a region of interest of a subject in an imaging region;
    introducing a contrast agent into the subject for enhancing selected tissue in the region of interest;
    exciting magnetic resonance in dipoles of the imaging region;
    applying gradient pulses that define sampling trajectories through k-space, the sampling trajectories repeatedly sampling at least one common point in k-space;
    receiving the magnetic resonance signals along the sampling trajectories and demodulating the magnetic resonance signals;
    monitoring a signal intensity of the common point;
    comparing the monitored common point intensities with preselected intensity criteria;
    one of automatic and manual triggering of a diagnostic imaging sequence in response to meeting the preselected intensity criteria;
    reconstructing a diagnostic image representation from demodulated magnetic resonance signals received in a preselected temporal relationship to the monitored common point intensities meeting the intensity criteria.

9. The method of magnetic resonance imaging including:
    introducing a contrast agent into a subject for enhancing selected tissue in a region of interest;
    exciting magnetic resonance in dipoles of the region of interest;
    applying gradient pulses that define sampling trajectories through k-space, the sampling trajectories repeatedly crossing at least one common point in k-space;
    receiving the magnetic resonance signals along the sampling trajectories and demodulating the magnetic resonance signals;

monitoring signal intensity values of the common point;

comparing the monitored common point intensity values with preselected intensity criteria;

in response to the common point intensity values meeting the intensity criteria, reconstructing a verification image representation from the demodulated magnetic resonance signals; and, comparing the verification image representation with preselected image criteria to verify the arrival of the contrast agent in the region of interest.

10. A magnetic resonance apparatus comprising:

a magnetic assembly which generates a temporally constant main magnetic field through an examination region;

gradient coils that apply gradient pulses to the examination region, the gradient pulses defining sampling trajectories through k-space;

an RF coil assembly which excites resonance in dipoles of a subject disposed in the examination region;

at least one radio frequency receiver for demodulating the resonance signals from the RF coil assembly along the trajectories;

an intensity monitor for repeated monitoring an intensity of a center of k-space, which oversampled center of k-space is repeatedly sampled during the collection of data lines for a single image;

a reconstruction processor which reconstructs the demodulated resonance signals into an image representation;

a human-readable display.

11. A magnetic resonance apparatus including:

a magnet assembly which generates a temporally constant main magnetic field through an examination region;

gradient coils that apply gradient pulses to the examination region, the gradient pulses defining sampling trajectories through k-space;

an RF coil assembly which excites resonance in dipoles of a subject disposed in the examination region;

at least one radio frequency receiver for demodulating the resonance signals from the RF coil assembly along the trajectories to form data lines;

a reconstruction processor which reconstructs the data lines into an image representation;

a human-readable display;

an intensity monitor for repeated monitoring an intensity of a preselected oversampled point in k-space, which preselected, oversampled point is repeatedly sampled during the collection of data lines for a single image;

an intensity analyzer that analyzes changes in the oversampled point intensity to determine a presence of a contrast agent in the region of interest.

12. The magnetic resonance apparatus as set forth in claim 11, wherein the intensity analyzer controls the reconstruction processor to (i) repeatedly reconstruct fast scan images that allow an operator to visually verify the arrival of the contrast agent in the region of interest, and (ii) diagnostic images in response to the determination of the presence of the bolus in the region of interest.

13. A magnetic resonance apparatus comprising:

a magnet assembly which generates a temporally constant main magnetic field through an examination region;

gradient coils that apply gradient pulses to the examination region, the gradient pulses defining a sampling trajectory through k-space;

an RF coil assembly which excites resonance in dipoles of a subject disposed in the examination region;

at least one radio frequency receiver for demodulating the resonance signals from the RF coil assembly along the trajectory to form data lines;

a reconstruction processor which reconstructs the data lines into an image representation;

a human-readable display;

an intensity analyzer for repeated analyzing an intensity of a preselected oversampled point in k-space, which preselected, oversampled point is repeatedly sampled during the collection of data lines for a single image, intensity analyzer being connected with the human readable display to provide an operator with a repeatedly updated human readable display of the oversampled point intensity.

14. A method of diagnostic imaging comprising:

generating a plurality of differently encoded data lines, a plurality of the data lines sharing a common, oversampled point;

monitoring changes in an intensity of the oversampled point;

generating a series of fluoroscopic images;

in response to the monitored changes in oversampled point intensity and one of the fluoroscopic images indicating a presence of a bolus of contrast agent in an imaged region, generating a diagnostic image.

15. The method as set forth in claim 14, wherein at least some data lines are used in the reconstruction of both the fluoroscopic and diagnostic images.

16. The method as set forth in claim 15, wherein the data line generating step includes:

sampling resonance signals along a plurality of trajectories through k-space that pass through the oversampled point.

17. The method as set forth in claim 14, wherein the monitored changes in the oversampled point and the fluoroscopic image are converted into a human readable display.

18. The method as set forth in claim 14, further including injecting a contrast agent into an imaged subject.

19. The method as set forth in claim 14 further including:

discarding fluoroscopic images generated prior to arrival of the bolus.

20. The method as set forth in claim 14 further including:

generating a baseline image prior to arrival of the bolus.

21. The method as set forth in claim 20 further including:

combining the baseline image and subsequent images.

22. A magnetic resonance imaging apparatus comprising:

a means for supporting a region of interest of a subject in an imaging region, which subject is injected with a contrast agent for enhancing selected tissue in the region of interest;

a means for exciting magnetic resonance in dipoles of the imaging region;

a means for applying gradient pulses that define sampling trajectories through k-space, the sampling trajectories repeatedly sampling a common point in k-space;

a means for receiving the magnetic resonance signals along the sampling trajectories and demodulating the magnetic resonance signals;

a means for monitoring a signal intensity of the oversampled, common point to determine the presence of the contrast agent;

a means for reconstructing an image representation from the demodulated magnetic resonance signals in response to the monitored signal intensity of the oversampled common point indicating the presence of the contrast agent in the region of interest.

* * * * *